United States Patent
Schemenaur et al.

(10) Patent No.: US 6,781,506 B2
(45) Date of Patent: Aug. 24, 2004

(54) RESISTOR STRUCTURE

(75) Inventors: John Schemenaur, Marlborough, MA (US); Rajan Hariharan, Deluth, GA (US); Marc Langlois, Atlanta, GA (US); Craig S. Allen, Shrewsbury, MA (US)

(73) Assignee: Shipley Company, L.L.C., Marlborough, MA (US)

( * ) Notice: Subject to any disclaimer, the term of this patent is extended or adjusted under 35 U.S.C. 154(b) by 0 days.

(21) Appl. No.: 10/340,992

(22) Filed: Jan. 13, 2003

(65) Prior Publication Data

US 2003/0231099 A1 Dec. 18, 2003

Related U.S. Application Data

(60) Provisional application No. 60/347,668, filed on Jan. 11, 2002.

(51) Int. Cl.[7] .............................................. H01C 1/012
(52) U.S. Cl. ...................... 338/307; 338/309; 428/606; 428/607
(58) Field of Search ................................. 338/308, 309; 428/606, 607

(56) References Cited

U.S. PATENT DOCUMENTS

| | | | | |
|---|---|---|---|---|
| 5,243,320 A | * | 9/1993 | Clouser et al. | 338/308 |
| 5,679,230 A | * | 10/1997 | Fatcheric et al. | 205/50 |
| 6,372,113 B2 | * | 4/2002 | Yates et al. | 205/111 |
| 6,489,035 B1 | * | 12/2002 | Wang et al. | 428/469 |
| 6,569,543 B2 | * | 5/2003 | Brenneman et al. | 428/607 |
| 6,610,417 B2 | * | 8/2003 | Andresakis et al. | 428/607 |
| 2003/0048172 A1 | * | 3/2003 | Meigs et al. | 338/308 |

* cited by examiner

Primary Examiner—Karl D. Easthom
(74) Attorney, Agent, or Firm—S. Matthew Cairns

(57) ABSTRACT

Disclosed is a resistor structure for embedding in a dielectric material including a thin film resistive material disposed on a surface of a conductive layer wherein the surface has an isotropic surface roughness having a Rz (din) value of 3 to 10 μm and a peak-to-peak wavelength of 2 to 20 μm.

10 Claims, 6 Drawing Sheets

RESISTOR STRUCTURE

This application claims benefit of 60/347,668 Jan. 11, 2002.

BACKGROUND OF THE INVENTION

The present invention relates generally to the field of resistors. In particular, the present invention relates to resistors that can be embedded within a dielectric material, such as in the manufacture of a printed circuit board.

A variety of thin film resistor structures, such as embeddable thin film resistors, are known. These resistor structures are typically prepared by the deposition of a resistive material on a conductive substrate, such as a copper foil. For example, International Patent Application WO 89/02212 (Rice) discloses the formation of resistive material by electroplating a layer of nickel-phosphorus on a copper foil. U.S. Pat. No. 6,208,234 B1 (Hunt et al.) discloses the deposition of a resistive material on a substrate using combustion chemical vapor deposition ("CCVD") or controlled atmosphere CCVD ("CACCVD"). These materials are then typically trimmed to provide materials having the desired resistance.

The resistance of these resistor structures depends upon both the thickness of the resistive material and the resistivity of the resistive material. There is interest in the printed wiring board industry for resistors having higher resistivities. As the thickness of the resistive material decreases, the resistance of the material increases. Thus, the thickness of the resistive materials used in these resistor structures is decreasing. Thinner resistive material layers mean that the topography of the underlying conductive substrate becomes a significant consideration.

Copper foils are typically produced by the electrodeposition of copper from a solution onto a rotating drum. The side of the copper foil adjacent the drum is the smooth (or shiny) side while the other side has a much higher roughness (the matte side). The matte side of the foil typically provides better adhesion to a substrate, e.g. a polymeric layer such as a photoresist or prepreg. The shiny side of the foil must have some form of roughening layer deposited on it in order to provide sufficient adhesion to a polymeric coating or layer. A variety of roughening treatments for foils are known. For example, U.S. Pat. No. 5,679,230 (Fatcheric et al.) discloses copper foils having a roughening agent added to the shiny side and a nodular copper deposit on the matte side.

It is known to deposit a resistive material on the rough side of a copper foil in the formation of embeddable, thin film resistors. For example, in the above described International Patent Application WO 89/02212, the formation of a resistive structure by electroplating a layer of nickel-phosphorus as resistive material on the matte (or rough) side of a copper foil is described.

Applying the resistive material to the matte side of the foil is thought to improve the adhesion between the resistive material and the foil, as in the case of polymeric coatings. Thus, the rougher the surface, the better the adhesion of the resistive material to the foil. However, very rough surfaces cause other problems when thin resistive layers are used. As an example, a rougher foil surface requires more resistive material be deposited than a smoother foil surface to obtain a structure having a given sheet resistivity. Typically, the addition of more resistive material requires additional deposition procedures as compared to those required for a smoother foil. When the resistive material includes expensive metals, such as platinum, the cost using a rougher surface greatly increases, both from the increased cost due to more material being used as well as increased processing and/or manufacturing times.

The topographic structure of metal foils are conventionally evaluated by looking at the roughness of the surface, that is the peak-to-valley distance. Such roughness is variously reported as $R_{tm}$ or $R_{ms}$ roughness of a surface. See, for example, U.S. Pat. No. 5,454,926 (Clouser et al.) which describes a copper foil having a matte side $R_{tm}$ in the range of 4.5 to 18 $\mu$m. However, another problem affecting thin film resistors is the directionality of the roughness of a copper foil. Drums for the electroplating of copper are polished to provide a smooth surface. Such polishing typically results in grooves, ridges or other surface imperfections on the drum which are circumferential. As a result, such imperfections are transferred from the drum to the copper foil during deposition. These imperfections create directionality in the copper foil, which is then transferred to the resistive material deposited thereon. As a result, thin film resistors typically have a different resistance in a first direction as compared to a direction orthogonal to it. Such difference in resistance may not be great, but it may cause defects in the finished electronic device if the resistor is installed in the wrong direction.

Accordingly, there is a need for metal foils suitable for use in thin film resistor manufacture wherein the foils have sufficient roughness for good adhesion of the resistive material and require less resistive material to obtain a given sheet resistivity than conventional metal foils. It is also desired that such metal foils have an isotropic roughness.

SUMMARY OF THE INVENTION

In one aspect, the present invention provides a structure including a conductive layer having first and second sides and a resistive material disposed on and in intimate contact with the first side of the conductive layer, wherein the first side of the conductive layer has an isotropic surface roughness having a Rz (din) value of 3 to 10 $\mu$m and a peak-to-peak wavelength of 2 to 20 $\mu$m.

In another aspect, the present invention provides a method of manufacturing a resistive structure including the steps of: a) providing a conductive layer have first and second sides wherein the first side has an isotropic surface roughness having a Rz (din) value of 3 to 10 $\mu$m and a peak-to-peak wavelength of 2 to 20 $\mu$m; and b) depositing a resistive material on the first side of the conductive later.

In yet another aspect, the present invention provides a printed wiring board having including a resistor wherein the resistor includes a conductive layer having first and second sides and a resistive material disposed on and in intimate contact with the first side of the conductive layer, wherein the first side of the conductive layer has an isotropic surface roughness having a Rz (din) value of 3 to 10 $\mu$m and a peak-to-peak wavelength of 2 to 20 $\mu$m.

The present invention also provides a conductive foil having a first side and a second side, wherein the first side has an isotropic roughness having a Rz (din) value of 3 to 10 $\mu$m and a mean peak-to-peak wavelength of 2 to 20 $\mu$m. Typically, the first side is the drum or smooth side of the foil.

DETAILED DESCRIPTION OF THE INVENTION

Figure 1:
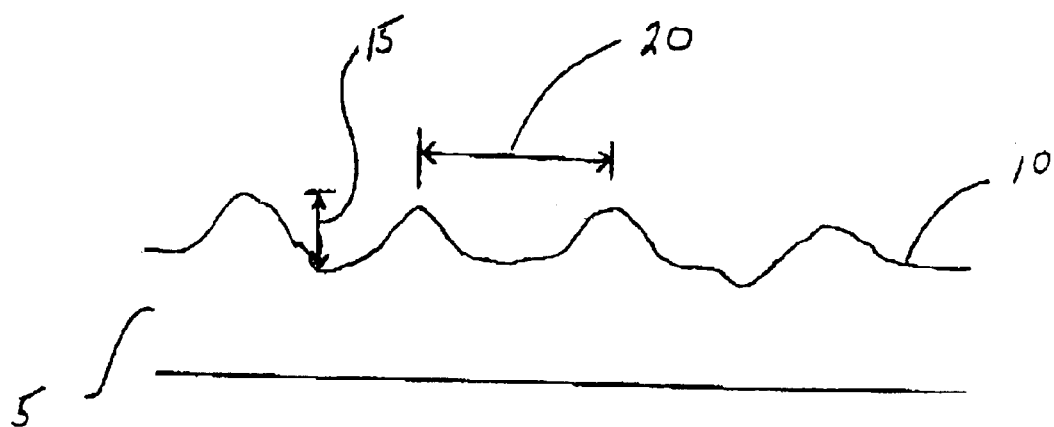
FIG. 1 illustrates a cross-sectional view of a copper foil, not to scale.

As used throughout this specification, the following abbreviations shall have the following meanings, unless the context clearly indicates otherwise: °C.=degrees Centigrade; $\mu$m=microns=micrometers; Å=angstroms; cm=centimeters; g=grams; m=millimeters; wt %=percent by weight; and oz.=ounces.

The terms "printed wiring board" and "printed circuit board" are used interchangeably throughout this specification. "Embedding dielectric material" refers to a dielectric material that is capable of having an item, such as a resistor, embedded within it. "Multilayer" refers to two or more layers.

All percentages are by weight, unless otherwise noted. All numerical ranges are inclusive and combinable in any order, except where it is obvious that such numerical ranges are constrained to add up to 100%.

The present invention provides a structure suitable for resistor fabrication including a conductive layer having first and second sides and a resistive material disposed on and in intimate contact with the first side of the conductive layer, wherein the first side of the conductive layer has an isotropic surface roughness having a Rz (din) value of 3 to 10 $\mu$m and a mean peak-to-peak wavelength of 2 to 20 $\mu$m.

A wide variety of conductive layers may be suitable employed in the present invention. Typically, the conductive layer is a conductive metal layers. Such conductive layers may be self-supporting, as in the case of a metal foil, or may be deposited on a substrate. Suitable metal foils include, but are not limited to, copper, silver, nickel, platinum, iridium, gold, tin, aluminum and the like, and alloys thereof. Suitable alloys include, but are not limited to, those containing tin such as tin copper or tin bismuth, chromium, bismuth, and the like. Preferred metal foils are copper, silver, gold, platinum and aluminum.

Conductive metal foils suitable for use in the present invention may have a wide range of thicknesses. Typically, such conductive metal foils have nominal thicknesses ranging from 0.0002 to 0.02 inches (0.005 mm to 0.5 mm). Metal foil thicknesses are often expressed in terms of weights. For example, suitable copper foils have weights of from 0.125 to 14 ounces per square foot (3.5 to 397 g per 929 cm$^2$), more preferably 0.25 to 6 ounces per square foot (7 to 170 g per 929 cm$^2$), and still more preferably from 0.5 to 5 ounces per square foot (14 to 140 g per 929 cm$^2$). Particularly suitable copper foils are those having weights of 3 to 5 ounces per square foot (85 to 140 g per 929 cm$^2$).

Suitable conductive metal foils may be prepared using conventional electrodeposition techniques. Preferably, the conductive foils are prepared using drum cathodes having a surface sufficient to impart the desired level of surface roughness and non-directionality to the drum side of the foil. In this manner, foils having a Rz (din) value of 3 to 10 $\mu$m and a mean peak-to-peak wavelength of 2 to 20 $\mu$m may be produced without the need for subsequent surface treatments. One suitable method for preparing the desired drum cathode is to prepare a drum cathode having a "smooth" surface which does not contain lay and which is substantially free of surface peaks and valleys. This drum is then coated with a photoresist, either dry film or liquid photoresist may be used. The photoresist is then imaged through a mask using the appropriate wavelength of actinic radiation followed by development of the photoresist. The drum is then etched and the remaining photoresist is stripped to provide a drum having the desired non-directional surface texture. When used as a cathode in the preparation of conductive metal foils, such textured drum will provide foils having the desired particulate lay and non-directionality.

Alternatively, a suitable metal foil may be obtained by surface treatment or surface modification of a conventional metal foil. For example, a layer of a conductive material, such as nickel, copper, silver and the like, may be deposited on the surface of a conventional metal foil in such a manner so as to provide a surface having a Rz (din) value of 3 to 10 $\mu$m and a mean peak-to-peak wavelength of 2 to 20 $\mu$m and substantial non-directionality. Such layer of conductive material may be deposited on the metal foil by a variety of techniques, including, without limitation, sputtering, electrodeposition, electroless deposition, and immersion plating.

Suitable conductive layers deposited on a substrate include self-supporting and non-self-supporting layers disposed on a substrate. Exemplary self-supporting conductive layers on a substrate include metal foils laminated to a substrate, such as a dielectric material, e.g. an epoxy or glass-filled epoxy material. Non-self-supporting conductive layers include thin metal layers that are deposited directly on a substrate. Suitable substrates include, but are not limited to, metals including conductive and non-conductive metals, dielectric materials, and the like. Exemplary dielectrics materials include organic dielectric materials, inorganic dielectric materials and mixtures thereof. Suitable dielectric materials include, but are not limited to, polyimides, polyacrylates, polyarylene ethers, polysulfones, epoxies, glass-filled organic dielectrics such as glass-filled epoxies or polyimides, ceramics, and the like. The conductive metal may be deposited on the substrate by a variety of means including, but not limited to, sputtering, chemical vapor deposition, physical vapor deposition, CCVD, CACCVD, electroplating, electroless plating, immersion plating, lamination, and the like. Any conductive metal may suitably be deposited on a substrate and used in the present invention.

The conductive layers of the present invention may further include a barrier layer. Such barrier layer may be on the first side of the conductive layer, i.e. the side nearest the resistive material, the second side of the conductive layer or on both sides of the conductive layer. When the barrier layer is on the first side of the conductive layer, then the surface of the conductive layer including the barrier layer must have an isotropic surface roughness having a Rz (din) value of 3 to 10 $\mu$m and a mean peak-to-peak wavelength of 2 to 20 $\mu$m.

Barrier layers are well known to those skilled in the art. Suitable barrier layers include, but are not limited to, zinc, indium, tin, nickel, cobalt, chromium, brass, bronze and the like. Such barrier layers may be deposited electrolytically, electrolessly, by immersion plating, by sputtering, by CVD, CACCVD, CCVD and the like. Preferably, such barrier layers are deposited electrolytically, electrolessly or by immersion plating. In one embodiment, when the conductive layer is a copper foil, it is preferred that a barrier layer is used.

Following the application of a protective barrier layer, a protective layer of chromium oxide may be chemically deposited on the conductive layer. Finally, a silane may be applied to the surface of the conductive layer/barrier layer/optional chromium oxide layer in order to further improve adhesion. Suitable silanes are those disclosed in U.S. Pat. No. 5,885,436 (Ameen et al.).

The Rz (din) value is the average maximum peak-to-valley height of any five consecutive sampling lengths within the measurement length. The peak-to-valley distance is the distance between the height of a surface feature and a trough or valley in the surface. Such Rz (din) values are typically 3 to 10 μm, more typically 3.1 to 9.9 μm, and even more typically 3.2 to 9.5 μm. The peak-to-peak wavelength of the surface features is 2 to 20 μm, more typically 4 to 15 μm, and even more typically 6 to 14 μm. The term "wavelength" refers to the repeat length of a periodic function, specifically the distance between peaks of like height on the conductive layer surface. FIG. 1 illustrates a cross-sectional view, not to scale, of copper foil 5 having a rough surface 10 and containing a peak-to-valley dimension 15 and a peak-to-peak wavelength dimension 20.

Figure 2:
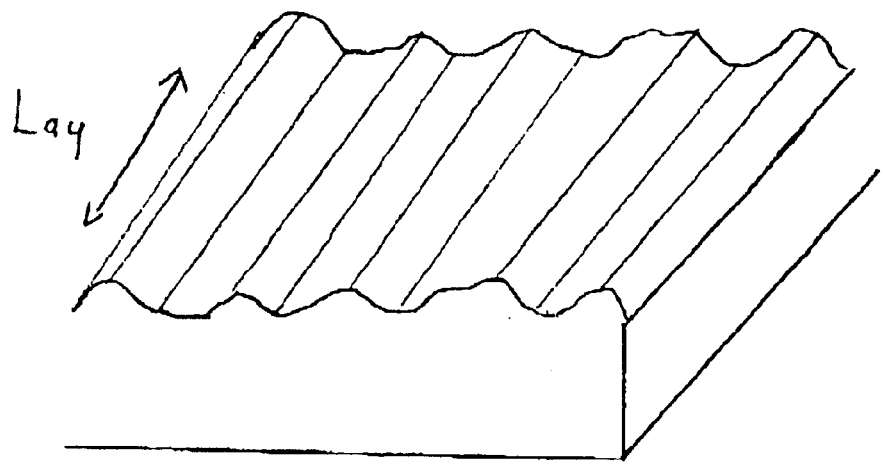
FIG. 2 illustrates a cross-sectional view of an anisotropic copper foil, prior art.
Figure 3:
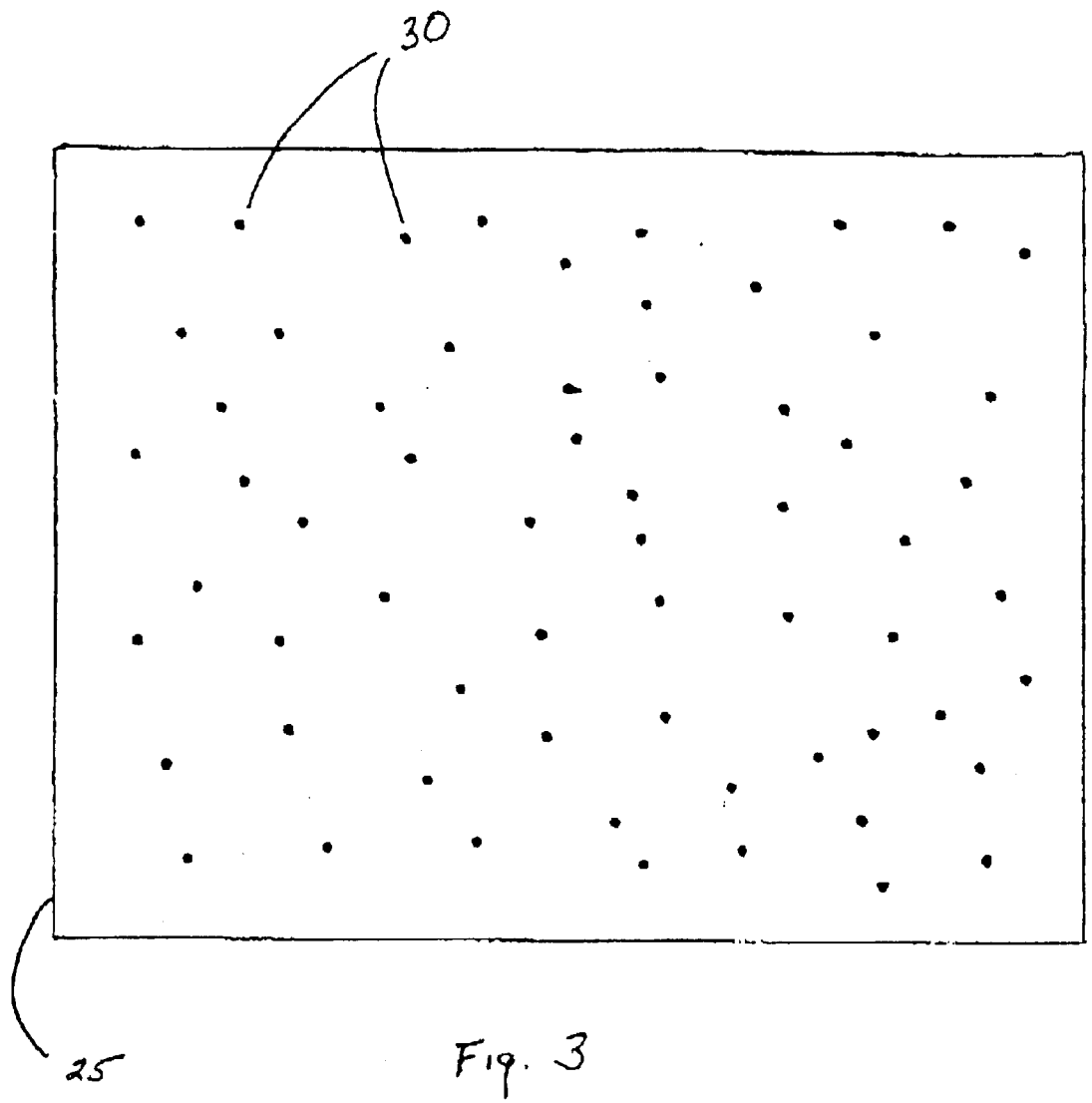
FIG. 3 illustrates a top view of a copper foil having features showing particulate lay, not to scale.

The conductive layers of the present invention have isotropic surface roughness. By the term "isotropic surface roughness" it is meant that the surface roughness of the conductive layer has substantially no directionality, i.e. that the surface roughness in one direction is within 10% of that in an orthogonal direction, and preferably within 5%. Preferably, the surface roughness has no directionality. Unlike conventional foils used in thin film resistor formation, the present conductive layers have no lay. "Lay" refers to the predominate direction of the surface texture. Surfaces that have no characteristic direction are referred to as "isotropic" and said to have "non-directional", "particulate" or "protuberant" lay. FIG. 2 illustrates a cross-sectional view of a conventional copper foil, not to scale, showing the directional texture or lay of the rough surface. FIG. 3 illustrates a top view of a copper foil 25 having particulate or non-directional lay, where the peaks 30 show no directionality to the texture.

The foils of the present invention also have a root mean square ("Rms") roughness value of 0.2 to 2 μm. Preferably, the Rms value is 0.4 to 1.6 μm, and more preferably 0.5 to 1.5 μm. The present foils also have an Ra value of 0.5 to 1.5 μm. The Ra value is the arithmetic average of all absolute distances of the roughness profile from the center line within the measuring length. For 1 oz. (28 g) copper foil, the Ra value is typically from 0.7 to 1.5 μm, and for 0.5 oz. (14 g) copper foil, the Ra value is typically from 0.6 to 1.2 μm.

A variety of methods may be used to measure the directionality of a surface and the periodicity of the surface features. One suitable method for both determining directionality and periodicity is an autocovariance function. The two-dimensional autocovariance function is a function of direction and distance and represents the expected value of the height product of all two-point pairs that are separated by certain length in a direction. In other words, the autocovariance function describes the characteristic feature length, i.e. the length between two peaks having a certain height. For a description of the application of an autocovariance function to the determination of surface topography, see Kiely et al., *Quantification of Topographic Structure by Scanning Probe Microscopy*, Journal of Vacuum Science Technology B, vol. 15, no. 4, July/August 1997, pp 1483–1493. Preferably, the directionality and periodicity of the surface features are determined using atomic force spectroscopy ("AFM") or an optical profilometer.

The electrical resistance of a resistor is determined by the resistivity of the material, as well as the length and cross-sectional area of the resistor. While very thin films are desirable from the standpoint of material efficiency, where power loading (current flow) is high, thicker films may be required. For higher power loading requirements where thicker films are required, the resistivity of the material may need to be higher, e.g., by using more heavily doped metals as the resistive material.

Any resistive material may be advantageously used in the present invention. Suitable resistive materials include, but are not limited to, a mixture of a conductive material and a minor amount of a highly resistive (dielectric) material. A very small amount of the highly resistive material, e.g., about 0.1 wt % to about 20 wt %, very profoundly reduces the conductive properties of the conducting material. For example, platinum, though an excellent conductor, when co-deposited with between 0.1 and about 5 wt % silica, serves as a resistor, the resistance being a function of the level of silica co-deposited. Any conductive material is suitable, such as, but not limited to, platinum, iridium, ruthenium, nickel, copper, silver, gold, indium, tin, iron, molybdenum, cobalt, lead, palladium, and the like. Suitable dielectrics include, but are not limited to, metal oxides or metalloid oxides, such as silica, alumina, chromia, titania, ceria, zinc oxide, zirconia, phosphorous oxide, bismuth oxide, oxides of rare earth metals in general, phosphorus, and mixtures thereof.

Preferred electrically resistive materials of the present invention are platinum-based, i.e., the major material is platinum. The resistive materials contain from about 10 to 70 mole percent iridium, ruthenium or mixtures thereof, and preferably 2 mole percent to 50 mole percent, calculated relative to platinum being 100 percent. If ruthenium is used alone (without iridium), it is preferably used at between about 2 and about 10 mole percent calculated relative to platinum being 100 percent. If iridium is used alone (without ruthenium), it is preferably used at between about 20 and about 70 mole percent calculated relative to platinum being 100 percent. In the resistive materials in accordance with the invention, the iridium, ruthenium or mixtures thereof exist in both elemental form and in oxide form. Typically, the iridium, ruthenium or mixtures thereof are from about 50 to about 90 mole percent elemental metal and from about 10 to about 50 mole percent oxide(s) of the iridium, ruthenium or mixtures thereof.

The resistive materials may be deposited by a variety of means, such as sol-gel deposition, sputtering, chemical vapor deposition, CCVD, CACCVD, electroplating, and the like. For example, nickel-phosphorus resistive materials may be deposited by electroplating. See, for example, International Patent Application No. WO 89/02212, described above. It is preferred that the resistive materials are deposited by CCVD and/or CACCVD. The deposition of resistive materials by CCVD and/or CACCVD is well known to those skilled in the art. See, for example, U.S. Pat. No. 6,208,234 (Hunt et al.) for a description of such processes and apparatuses used.

CCVD has the advantages of being able to deposit very thin, uniform layers which may serve as the dielectric layers of embedded capacitors and resistors. For embedded resistors, the deposited layers are typically at least about 40 Å thick. The material can be deposited to any desired thickness; however, for forming resistive material layers by CCVD, thicknesses seldom exceed 50,000 Å. (5 microns). Generally film thicknesses are in the 100–10,000 Å range, most generally in the 300–5000 Å range. Because the thinner the layer, the higher the resistance and the less material, e.g., platinum used, the ability to deposit very thin films is an advantageous feature of the CCVD process. The thinness of the coating also facilitates rapid etching in processes by which discrete resistors are formed.

For resistive material which is a mixture of a conductive metal and a minor amount of a dielectric material, the metal must be capable of being deposited as a zero valence metal from an oxygen-containing system if the resistive material is to be deposited by CCVD or CACCVD. The criteria for deposition in the zero valence state using a flame is that the metal must have a lower oxidation potential than the lower of the oxidation potential of carbon dioxide or water at the deposition temperature. (At room temperatures, water has a lower oxidation potential; at other temperatures carbon dioxide has a lower oxidation potential.) Zero valence metals which can be readily deposited by CCVD are those having oxidation potentials about equal to silver or below. Thus, Ag, Au, Pt, and Ir can be deposited by straight CCVD. Zero valence metals having somewhat higher oxidation potentials may be deposited by CACCVD which provides a more reducing atmosphere. Ni, Cu, In, Pd, Sn, Fe, Mo, Co and Pb are best deposited by CACCVD. Herein, metals also include alloys that are mixtures of such zero-valence metals. Silicon, aluminum, chromium, titanium, cerium, zinc, zirconium, magnesium, bismuth, rare earth metals, and phosphorous each have relatively high oxidation potentials, such that if any of the metals mentioned above are code-posited with the appropriate precursors for the dielectric dopants, the metals will deposit in the zero valence state and the dopant will deposit as the oxide. Thus, even when no flame is used the dielectric needs to have a higher oxidation, phospidation, carbidation, nitrodation, or boridation potential, to form the desired two phases.

For more oxygen-reactive metals and alloys of metals, CACCVD may be the process of choice. Even if the metal can be deposited as a zero valence metal by straight CCVD, it may be desirable to provide a controlled atmosphere, i.e., CACCVD, if the substrate material on which it is to be deposited is subject to oxidation. For example, copper and nickel substrates are readily oxidized, and it may be desired to deposit onto these substrates by CACCVD.

Another type of resistive material which can be deposited as a thin layer on a substrate by CCVD is "conductive oxides". In particular, $Bi_2Ru_2O_7$ and $SrRuO_3$ are conductive oxides which may be deposited by CCVD. Although these materials are "conductive", their conductivity is relatively low when deposited in amorphous state; thus, a thin layer of such mixed oxides can be used to form discrete resistors. Like conductive metals, such "conductive oxides" may be doped with dielectric materials, such as metal or metalloid oxides, to increase their resistivity. Such mixed oxides may be deposited either as amorphous layers or as crystalline layers, amorphous layers tending to deposit at low deposition temperatures and crystalline layers tending to deposit at higher deposition temperatures. For use as resistors, amorphous layers are generally preferred, having higher resistivity than crystalline materials. Thus, while these materials are classified as "conductive oxides" in their normal crystalline state, the amorphous oxides, even in un-doped form, may produce good resistance. In some cases it may be desired to form low resistance, 1–100 Ω, resistors and a conduction-enhancing dopant, such as Pt, Au, Ag, Cu or F, may be added. If doped with dielectric material, e.g., metal or metalloid oxides, to increase resistivity of the conducting oxides, or conduction-enhancing material to decrease resistivity of the conducting oxides, such homogeneously mixed dielectric or conduction-enhancing material is generally at levels between 0.1 wt % and 20 wt % of the resistive material, preferably at least 0.5 wt %.

There are a variety of other "conducting materials" which though electrically conducting, have sufficient resistivity to form resistors in accordance with the present invention. Examples include yttrium barium copper oxides and $La_{1-x}Sr_xCoO_3$, $0 \leq x \leq 1$, e.g., x=0.5. Generally, any mixed oxide which has superconducting properties below a critical temperature can serve as electrically resistive material above such critical temperature. Deposition of such a variety of resistive materials is possible with proper selection of precursors selected from those described herein above.

To produce a metal/oxide resistive material film, precursor solution is provided which contains both the precursor for the metal and the precursor for the metal or metalloid oxide. For example, to produce platinum/silica films, the deposition solution contains a platinum precursor, such as platinum(II)-acetylacetonate or diphenyl-(1,5-cyclooctadiene) platinum (II) [Pt(COD)] and a silicon-containing precursor, such as tetraethoxysilane. Suitable precursors for iridium and ruthenium include, but are not limited to, tris (norbornadiene) iridium (III) acetyl acetonate ("IrNBD"), and bis (ethylcyclopentadienyl) ruthenium (II). The precursors are mixed generally according to the ratio of metal and enhancing material to decrease the resistivity of the material being deposited, an additional precursor is provided so as to produce minor amounts of the metal oxide or metalloid oxide, e.g., between 0.1 and 20 wt %, preferably at least about 0.5 wt %, of the deposited doped conducting metal oxide. The precursors typically are co-dissolved in a single solvent system, such as toluene or toluene/propane to a concentration (total of platinum, iridium, and/or ruthenium precursors) of from about 0.15 wt % to about 1.5 wt %. This solution is then typically passed through an atomizer to disperse the precursor solution into a fine aerosol and the aerosol is ignited in the presence of an oxidizer, particularly oxygen, to produce the platinum and iridium, ruthenium or mixture thereof zero valence metals(s) and oxide(s).

Thus, the present invention provides a method of manufacturing a resistive structure including the steps of: a) providing a conductive layer have first and second sides wherein the first side has an isotropic surface roughness having a Rz (din) value of 3 to 10 μm and a peak-to-peak wavelength of 2 to 20 μm; and b) depositing a resistive material on the first side of the conductive later.

The resistive material structures described herein can be fabricated into resistors, either as embedded resistors, or as resistors on the surface of a printed circuit board within integrated circuits or other electronic applications. This is generally accomplished using a photoresist which is used to form a resist pattern over the layer of resistive material and using an appropriate etchant to remove the resistive material in areas not covered by the resist. For metal/oxide resistive material layers, the etchant chosen is an etchant for the metal component of the resistive material. Typically such etchants are acids or Lewis acids, e.g., $FeCl_3$ or $CuCl_2$ for copper. Nitric acid and other inorganic acids (e.g., sulfuric, hydrochloric, and phosphoric) may be used to etch nickel, a variety of other metals which may be deposited as well as conductive oxides.

Also, although noble metals are conductors, it is found that in depositing noble metals along with relatively minor amounts of oxides, such as silica or alumina, the deposited material becomes highly resistive. Accordingly, metals, such as platinum, containing minor amounts, e.g., 0.1%–5% of an oxide, can serve as resistors in printed circuit board. Such material can be deposited as a layer on a printed circuit board and then processed by printed circuit board techniques to provide discrete resistors. However, noble metals, by their non-reactive nature, are difficult to etch, as is required in many processes for production of printed circuit boards. Herein, it is proposed to use aqua regia as an etchant for metals, particularly noble metals, in printed circuit board processes. Aqua regia is made from two well-know acids: 3 parts concentrated (12M) hydrochloric acid (HCl) and 1 part concentrated (16M) nitric acid $HNO_3$. Thus, the molar ratio of hydrochloric acid to nitric acid is 9:4, although slight variations from this ratio, i.e., 6:4 to 12:4 would be acceptable for etching purposes in accordance with the invention. Because of its corrosive nature and limited shelf life, aqua regia is not sold commercially, but must be prepared on site. To reduce its corrosiveness, the aqua regia may be diluted with water up to about a 3:1 ratio of water to aqua regia. On the other hand, the noble metals, such as platinum, are not etched by many of the materials suitable for etching copper, such as $FeCl_3$ or $CuCl_2$, thereby allowing for a variety of selective etching options in forming printed circuit boards. The speed of etching will depend upon several factors including the strength of the aqua regia and the temperature. Typically, aqua regia etching is conducted at a temperature of 55–60° C., although this may be varied depending upon the application.

Figure 4A:
FIGS. 4a–4g are cross-sectional views of structures representing a process for fabricating a resistor from a free-standing foil having a resistive material layer disposed thereon.

Illustrated in FIGS. 4a–g are cross-sectional views representing a circuitization process which begins with a conductive foil 900, such as a copper foil, to which a layer of electrically resistive material 905 has been deposited, such as by CCVD or CACCVD, this two-layer structure being represented in FIG. 4a. Photoresist layers 910 and 915 are then applied to both sides of the two-layer structure. The photoresist 910 covering the resistive material layer 905 is exposed to patterned actinic radiation while the photoresist 915 covering the conductive foil 900 is blanket-exposed to actinic radiation. The photoresists are then developed, giving the structure of FIG. 4b with a patterned photoresist layer covering the resistive material layer 905 and the blanket-exposed photoresist layer 915 protecting the conductive foil.

Figure 4B:
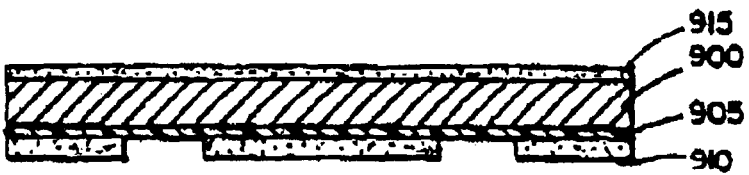
Figure 4C:
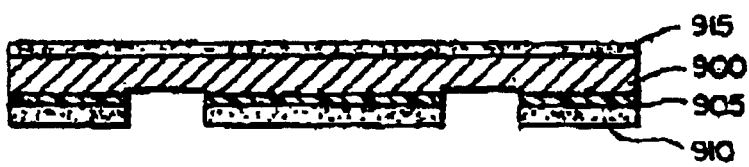

As shown in FIG. 4c, the resistive material layer 905 is then selectively etched from areas where the photoresist 910 had been removed. Subsequently, the remaining photoresist 910, 915 is stripped.

Figure 4D:
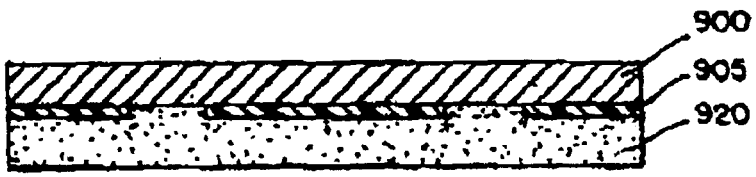
Figure 4E:
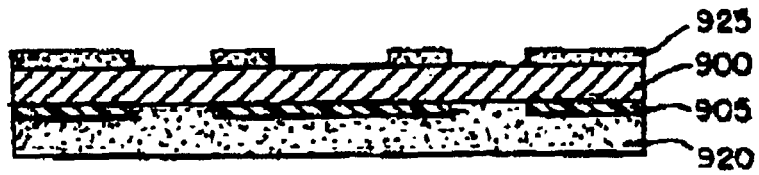
Figure 4F:
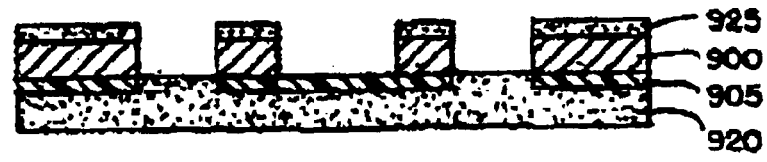
Figure 4G:
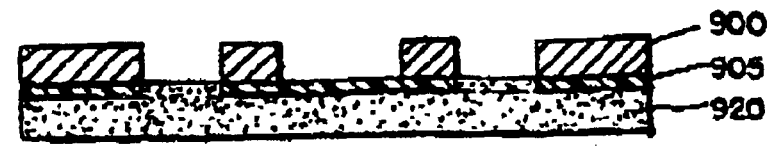

Following this, as shown in FIG. 4d, an organic laminate 920 is applied to the resistive material side of the structure. The laminate protects the now-patterned resistive material layer 905 from further processing and subsequently supports patches of the resistive material layer 905 when portions of the conductive foil is subsequently removed from the other side of the resistive material layer.

Next, a photoresist layer 925 is applied to the conductive foil 900. This is imaged with patterned actinic radiation and developed, giving the structure shown in FIG. 4e. Following this, the conductive foil 900 is etched with an etchant which selectively etches the conductive foil 900 but which does not etch the resistive material layer 905, leaving the structure shown in FIG. 4f. Stripping of the photoresist 925 leaves the resistor structure shown in FIG. 4g. This structure may subsequently be embedded in dielectric material (not shown).

As a variation of this process, it should be noted that if an etchant is used which selectively etches the electrically resistive material layer 905 but does not etch or only partially etches the conductive foil 900, the use of resist layer 915 (FIGS. 4b and 4c) is not necessary.

When referring herein to "etching", the term is used to donate not only the common usage in this art where a strong chemical dissolves the material of one of the layers, e.g., nitric acid dissolves nickel, but also physical removal, such as laser removal and removal by lack of adhesion. In this regard, and in accordance with an aspect of this invention, it is found that resistive materials, such as doped nickel and doped platinum, deposited by CCVD or CACCVD are porous. The pores are believed to be small, typically of a diameter of a micron or less, preferably of a diameter of 50 nanometers or less (1000 nanometers=1 micron). Nevertheless, this permits liquid etchants to diffuse through the electrically resistive material layer and, in a physical process, destroy the adhesion between the resistive material layer and the underlying layer.

For example, in reference to FIGS. 4b and 4c, if the conductive foil layer 900 is copper and the resistive material layer 905 is doped platinum, e.g., platinum/silica, or doped nickel, e.g., $Ni/PO_4$, cupric chloride could be used to remove exposed portions of the resistive material layer. The cupric chloride does not dissolve either platinum or nickel, but the porosity of the resistive material layer allows the cupric chloride to reach the underlying copper. A small portion of the copper dissolves and the exposed portions of the electrically resistive layer 905 by physical ablation. This physical ablation occurs before the cupric chloride etches the underlying copper layer 900 to any significant extent.

If copper is the conductive material layer 900, it is sometimes advantageous to use copper foil that has been oxidized, which is commercially available. An advantage of an oxidized copper foil is that a dilute hydrochloric acid ("HCl") solution, e.g., ½%, dissolves copper oxide without dissolving zero valence copper. Thus, if the electrically resistive material layer is porous, such that the dilute HCl solution diffuses therethrough, HCl can be used for ablative etching. Dissolving the surface copper oxide destroys the adhesion between the copper foil and the electrically resistive material layer. As noted above with respect to the process shown in FIGS. 4a–4g, the use of such an etchant which does not attack the foil dispenses with the need for protective photoresist layer 915 (FIGS. 4b and 4c).

To minimize processing steps, the photoresists applied can be embeddable in materials, such as Shipley's permanent etch resist. Then both sides can be processed simultaneously if the etchant does not or only partially etches the conductor. In particular, only the resistor material side photoresist needs to be embeddable and the conductor side can be removed as a final processing step. Alternatively, the photoresists used on the conductor material side can be selected such that it is not removed with a specific stripper used to remove the resistor material side photoresist. Embeddable photoresist may decrease tolerance losses due to particular undercutting of resistor material which under cut material will ablate once the photoresist is removed.

It can be demonstrated that when using porous electrically resistive material layers, such as doped platinum and doped silica, with certain etchants, the etching process is a physical ablation process. This is because flakes of the electrically resistive material layer are found in the etchant bath. Because of this, the ablated resistive material can be separated from the etchant bath by physical means, such as filtration, settling, centrifugation, etc. This is particularly convenient for recovering expensive material, such as platinum.

To be practically removable by an ablative technique, the resistive material layer must generally be sufficiently porous to an etchant which does not dissolve the electrically resistive material but sufficiently attacks the surface of the underlying material such as to result in loss of interfacial adhesion and ablation of the electrically conductive material within about 2 to 5 minutes. At the same time, such etchant must not substantially attack the underlying material, e.g., copper foil, during the etching period as such would cause excessive undercutting or loss of mechanical strength (i.e., reduce handleability).

Figure 5A:
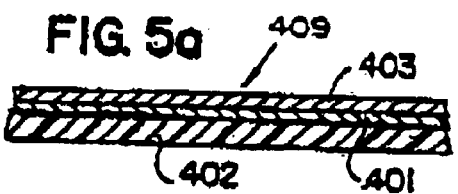
FIGS. 5a–5c are cross-sectional views of a three-layer resistor structure and processes for fabricating such structure.
Figure 5B:
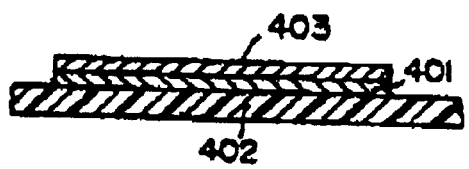

Shown in FIG. 5a is a three-layer structure 409 which comprises an insulating substrate 402, a layer of resistive material 401 (5a), e.g., platinum/silica, formed in accordance with the invention by CCVD, and a conductive layer 403 (5a), e.g., copper. Preferably, however, in reference to FIGS. 5a–5c, both the thin layer resist material patches 401 and the electrical connection conductive patches 403 are formed by photoimaging techniques.

The structure 409 of FIG. 5a might be patterned in one of two two-step procedures by photoimaging technology. In one procedure (with reference to FIG. 5b), the conductive material layer 403 (5a) would be covered with a resist, the resist patterned by photoimaging techniques, and, in the exposed areas of the resist, both the conductive material layer and the underlying resistive material layer be etched away, e.g., with aqua regia to give the structure of FIG. 5b having a patterned resistive material patch (401 (5b)) and a patterned conductive material patch (403 (5b)). Next, a second photoresist would be applied, photoimaged, and developed. This time, only the exposed portions of the conductive material patch 403 (5b) would be etched away by etchant which would selectively etch the conductive layer, but not the resistive material patch, i.e., FeCl$_3$ or CuCl$_2$ in the case of copper as the conductive material layer and platinum/silica as the electrically resistive material, thereby producing the resistor structure 400 of FIG. 5c. In an alternate procedure (with reference to FIG. 5c), a patterned resist layer would be formed, exposed portions of the conductive material layer 403 (5a) etched away, e.g., with FeCl$_3$, a further patterned resist layer formed, and then the exposed areas of the resistive material layer (401 (5b)) etched away with aqua regia so as to form the electrical contacts 403 and give the resistor structure of FIG. 5c. By either procedure, discrete thin layer resistors 400 are formed by conventional photoimaging techniques common to printed circuitry formation.

Figure 5C:
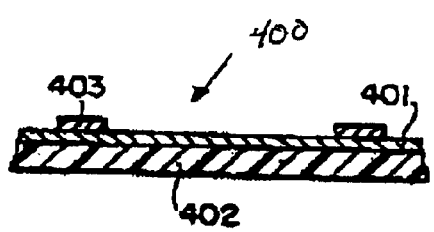
Figure 6:
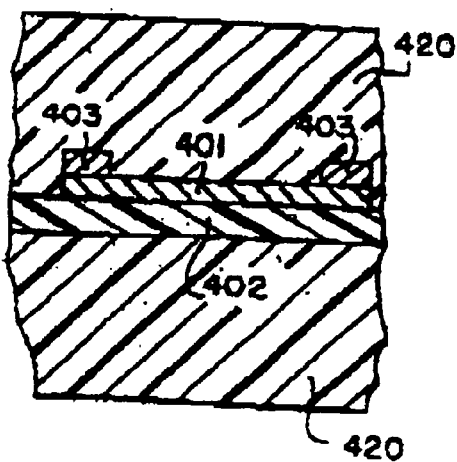
FIG. 6 is a cross-section view of a printed wiring board containing an embedded resistor.

While the resistor 400 of FIG. 5c could be at the surface of a printed circuit board device, the resistors will, in most cases, be embedded within a multi-layer printed circuit board as shown in FIG. 6 where the resistor 400, which was formed on an insulating substrate 402, such as polyimide, is embedded within additional embedding insulating material layers 420, such as epoxy/fiberglass prepreg material.

Accordingly, the present invention provides a printed wiring board having a resistor wherein the resistor includes a conductive layer having first and second sides and a resistive material disposed on and in intimate contact with the first side of the conductive layer, wherein the first side of the conductive layer has an isotropic surface roughness having a Rz (din) value of 3 to 10 μm and a peak-to-peak wavelength of 2 to 20 μm.

EXAMPLE

Figure 7A:
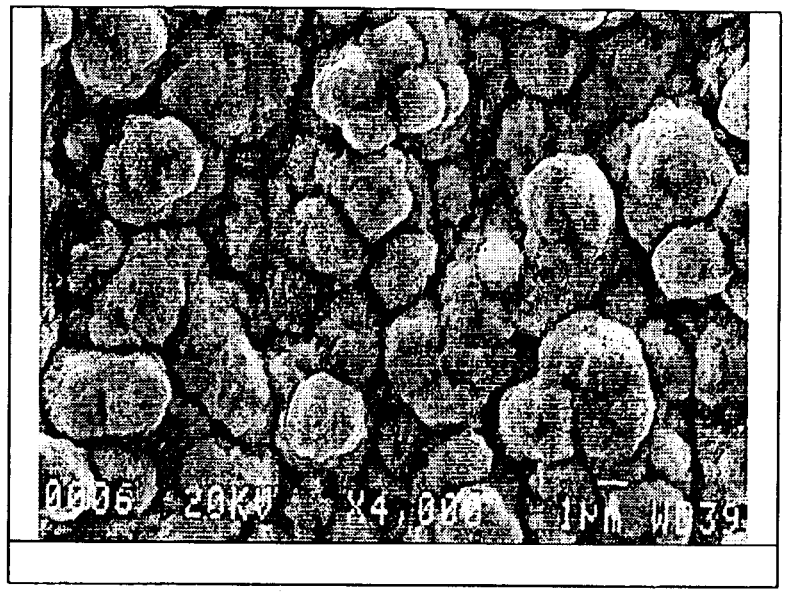
FIGS. 7A and 7B are electronmicrographs of a 0.5 oz. copper foil, normal view and 60 degree tilt, respectively.
Figure 7B:
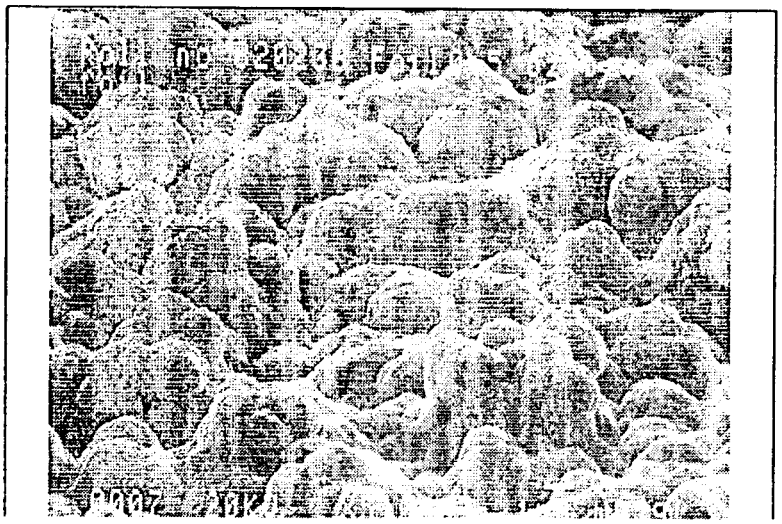
Figure 8A:
FIGS. 8A and 8B are electronmicrographs of a 1 oz. copper foil, normal view and 60 degree tilt, respectively.
Figure 8B:
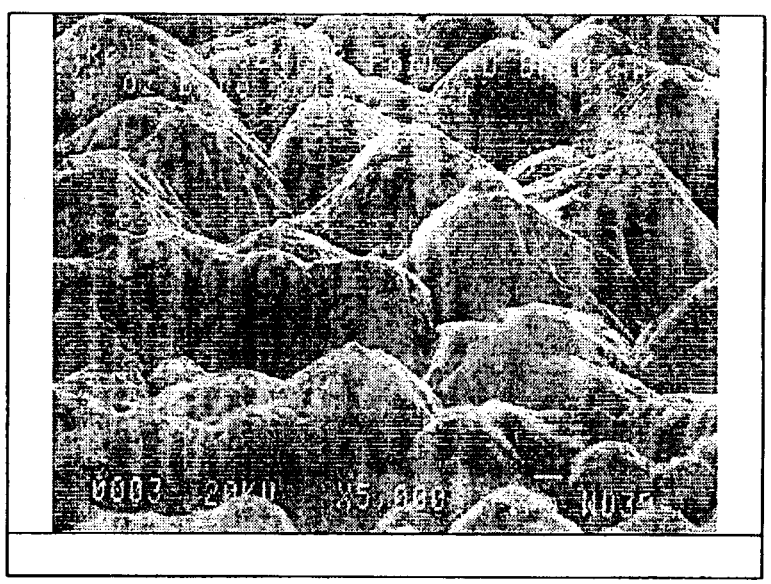

Two copper foils, 0.5 oz. (14 g) and 1 oz. (28 g), are prepared by electrodeposition of copper from solution on a rotating drum. A nickel coating is then electrodeposited on the matte side of each foil and a zinc coating is applied to the drum side of each foil. The nickel plated matte sides of each foil is evaluated by electron microscopy. FIGS. 7A and 7B show the surface topography of the matte side of the 0.5 oz. copper foil top view (at 4000×) and 60 degree tilt (5000×), respectively. FIGS. 8A and 8B show the surface topography of the matte side of the 1 oz. copper foil, top view (at 4000×) and 60 degree tilt (5000×), respectively. The surface roughness (Rms) values, Rz (din) values, Ra values and peak-to-peak wavelength values of the foils are determined with an optical profilometer and are reported in the table.

| Copper Foil | Ra (μm) | Rz(din) (μm) | Rms | Mean Peak-to-Peak Wavelength (μm) |
|---|---|---|---|---|
| 0.5 oz. | 0.74 | 3.11 | 0.90 | 3.5 |
| 1 oz. | 0.91 | 3.85 | 1.14 | 9.0 |

What is claimed is:

1. A structure comprising a conductive layer having first and second sides and a resistive material disposed on and in intimate contact with the first side of the conductive layer, wherein the first side of the conductive layer has an isotropic surface roughness having a Rz (din) value of 3 to 10 μm and a mean peak-to-peak wavelength of 2 to 20 μm.

2. The structure of claim 1 wherein the conductive layer is a metal foil.

3. The structure of claim 2 wherein the metal foil is selected from the group consisting of copper, silver, nickel, platinum, iridium, gold, tin, aluminum and alloys thereof.

4. The structure of claim 1 wherein the peak-to-peak wavelength is 7 to 10 μm.

5. The structure of claim 1 wherein the resistive material comprises platinum.

6. The structure of claim 5 wherein the resistive material further comprises iridium, ruthenium or mixtures thereof.

7. The structure of claim 1 wherein the resistive material has a thickness of 100–10,000 Å.

8. A method of manufacturing a resistive structure comprising the steps of: a) providing a conductive layer have first and second sides wherein the first side has an isotropic surface roughness having a Rz (din) value of 3 to 10 μm and a mean peak-to-peak wavelength of 2 to 20 μm; and b) depositing a resistive material on the first side of the conductive later.

9. A printed wiring board having comprising a resistor wherein the resistor includes a conductive layer having first and second sides and a resistive material disposed on and in intimate contact with the first side of the conductive layer, wherein the first side of the conductive layer has an isotropic surface roughness having a Rz (din) value of mean 3 to 10 μm and a mean peak-to-peak wavelength of 2 to 20 μm.

10. A conductive foil having a first side and a second side, wherein the first side has an isotropic roughness having a Rz (din) value of 3 to 10 μm and a mean peak-to-peak wavelength of 2 to 20 m.

* * * * *